(12) United States Patent
Kuroki

(10) Patent No.: US 6,700,169 B2
(45) Date of Patent: Mar. 2, 2004

(54) SEMICONDUCTOR MEMORY DEVICE

(75) Inventor: Kohichi Kuroki, Kanagawa (JP)

(73) Assignee: NEC Electronics Corporation, Kawasaki (JP)

( * ) Notice: Subject to any disclaimer, the term of this patent is extended or adjusted under 35 U.S.C. 154(b) by 0 days.

(21) Appl. No.: 10/358,617

(22) Filed: Feb. 5, 2003

(65) Prior Publication Data

US 2003/0151085 A1 Aug. 14, 2003

(30) Foreign Application Priority Data

Feb. 8, 2002 (JP) .......................................... 2002-032103

(51) Int. Cl.[7] ............................................... H01L 29/76
(52) U.S. Cl. ........................................ 257/401; 257/368
(58) Field of Search ................................. 257/401, 368, 257/773

(56) References Cited

U.S. PATENT DOCUMENTS

2003/0151085 A1 * 8/2003 Kuroki ........................ 257/315

FOREIGN PATENT DOCUMENTS

JP  2000-124415  4/2000

* cited by examiner

*Primary Examiner*—Mark V. Prenty
(74) *Attorney, Agent, or Firm*—Katten Muchin Zavis Rosenman

(57) ABSTRACT

A semiconductor memory device of the present invention having sense amplifier transistors connected to complementary bit lines of a memory cell array and sense amplifier driver transistors driving the sense amplifier transistors, wherein the sense amplifier transistors and the sense amplifier driver transistors have gate electrodes dividing a common diffusion layer region formed on the surface of a semiconductor substrate into two, respectively, the gate electrodes being arranged on the boundary of the diffusion layer region.

5 Claims, 19 Drawing Sheets

US 6,700,169 B2

SEMICONDUCTOR MEMORY DEVICE

BACKGROUND OF THE INVENTION

1. Field of the Invention

The present invention relates to a semiconductor memory device. More specifically, the present invention relates to arrangement of sense amplifier (SA) driver transistors driving sense amplifiers.

2. Description of the Prior Art

In recent years, high-speed operation of a consolidated DRAM equipped with a DRAM (Dynamic Random Access Memory) and a logic IC has been required and developed.

To realize the high-speed operation, non-shared type sense amplifiers are employed in a DRAM part in place of shared type sense amplifiers widely used in a general-purpose DRAM. In addition, sense amplifier driver transistors are distributed in sense amplifier arrays. The size of a sense amplifier region is increased. Reduction in size of the sense amplifier region is a new problem. It is essential to reduce the size of the sense amplifier region in order to reduce the manufacturing cost.

As a method for reducing the size of the sense amplifier region, the layout of the sense amplifier region shown in FIG. 18 is provided. In the layout, the size of a sense amplifier circuit 11 of the sense amplifier circuit 11 and a sense amplifier driver transistor 15 forming a sense amplifier region 2 is reduced.

The method contrives the shape of gates G of sense amplifier transistors (pair sense amplifier transistors 14) connected to one or more complementary bit lines (BT1 to BTm, BN1 to BNm) connected to a memory cell array. The shape of the gates G is U shaped on a diffusion layer region L forming sources S and drains D. Such shape can share the diffusion layer region L forming the sources S of the sense amplifier transistors to form the sense amplifier transistors. The gates G of the sense amplifier transistors can be formed on the same diffusion layer region L. The size of the sense amplifier circuit 11 can be reduced.

In the arrangement, the sense amplifier driver transistor 15 driving the sense amplifier transistors is arranged adjacent the sense amplifier circuit 11 in the bit line direction.

The length of the sense amplifier driver transistor 15 in the bit direction is about 1.0 $\mu$m. In N- and P-channels for one sense amplifier circuit, $\Delta L \approx 2.0$ $\mu$m. The size of the sense amplifier driver transistor 15 of the semiconduct or memory device in the bit line direction is expressed by 2.0 $\mu$m×the number of sense amplifier arrays. For example, in the case of 64 sense amplifier arrays, L=2.0 $\mu$m×64=128 $\mu$m (approximately).

A method for reducing the size of the sense amplifier driver transistor 15 is described in Japanese Patent Application Laid-Open No. 2000-124415. Its summary describes "having sense amplifiers including a pair of N channel MOS transistors and a pair of P channel MOS transistors connected to complementary bit lines of a memory cell array; and driver MOS transistors driving the sense amplifiers and distributed in the sense amplifiers, wherein the gates of the pair of N channel MOS transistors and the pair of P channel MOS transistors are U shaped on a diffusion layer, and the N- and P-channel side driver MOS transistors are arranged between the pair of N channel MOS transistors and the pair of P channel MOS transistors, respectively, so as to share the diffusion layer."

Japanese Patent Application Laid-Open No. 2000-124415 describes "Since the N- and P-channel sense amplifier MOS transistors and the sense amplifier driver MOS transistors share the diffusion layer, an increase in area of the sense amplifier part can be minimized."

The method for reducing the area of the sense amplifier region 2 has the following problem.

In Japanese Patent Application Laid-Open No. 2000-124415, as shown in FIG. 19, the sense amplifier driver circuit 15 is formed between the sense amplifier transistors of the pair sense amplifier transistors 14 forming the sense amplifier circuit 11. The source S and the drain D of the sense amplifier driver transistor 15 are formed to share the diffusion layer L forming the source S and the drain D of the sense amplifier transistors 14. This can prevent the size from being increased in the bit line direction.

FIG. 19 is the same as FIG. 18 in that the sense amplifier driver transistor 15 is arranged in the proximity of the sense amplifier circuit 11. The sense amplifier size is inevitably increased in the bit line direction by the sense amplifier driver transistor 15.

BRIEF SUMMARY OF THE INVENTION

3. Summary of the Invention

A semiconductor memory device of the present invention having sense amplifier transistors connected to complementary bit lines of a memory cell array and sense amplifier driver transistors driving the sense amplifier transistors, wherein the sense amplifier transistors and the sense amplifier driver transistors have gate electrodes dividing a common diffusion layer region formed on the surface of a semiconductor substrate into two, respectively, the gate electrodes being arranged on the boundary of the diffusion layer region.

BRIEF DESCRIPTION OF THE DRAWINGS

The above-mentioned and other objects, features and advantages of this invention will become more apparent by reference to the following detailed description of the invention taken in conjunction with the accompanying drawings, wherein.

DETAILED DESCRIPTION OF THE INVENTION

Embodiments of the present invention will be described below in detail with reference to the drawings.

In all the drawings of assistance in explaining the embodiments, those having the same function are indicated by the same numerals and the repeated description is omitted.

A semiconductor memory device according to this embodiment is a DRAM macro mounted on a system LSI (Large Scale Integration) and has memory cell array regions composed of one or more bank structures; a main word driver region and a Y decoder region arranged corresponding to each of the memory cell array regions; and a peripheral circuit region arranged to be common to the memory cell array regions.

The memory cell array region is divided in a lattice form in the row and column directions and has a memory cell array, a sense amplifier region, a sub-word driver and a crossing region.

The sense amplifier region is arranged adjacent to the memory cell array, e.g., in the column direction. The sub-word driver is arranged adjacent thereto, e.g., in the row direction. In the crossing region of the sense amplifier region and the sub-word driver, an FX driver and a control circuit of the sense amplifiers are arranged.

Figure 1A:
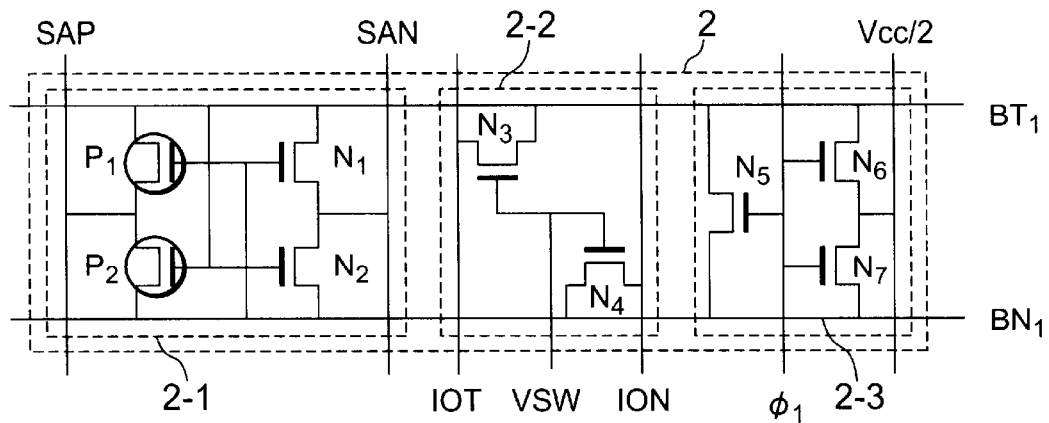
FIGS. 1A and 1B are circuit diagrams showing an essential part of a sense amplifier of a semiconductor memory device of an embodiment of the present invention.

In a sense amplifier region 2, as shown in FIG. 1A, a sense amplifier 2-1, an IO switch 2-2 and a precharge circuit 2-3 are arranged.

The sense amplifier 2-1 has Pch MOS transistors P1, P2 and Nch MOS transistors N1, N2, and senses and amplifies a very small signal from a memory cell.

The drain and the gate of the Pch MOS transistors P1, P2 are cross couple connected between complementary bit lines to form a PMOS sense amplifier. The drain and the gate of the Nch MOS transistors N1, N2 are also cross couple connected between the complementary bit lines to form an NMOS sense amplifier. The Pch MOS transistors P1, P2 share the source. Its common source wire is connected to an SAP.

The Nch MOS transistors N1, N2 share the source. Its common source wire is connected to an SAN.

The IO switch 2-2 connects the complementary bit lines and input/output lines by gate control of an array selection signal of a YSW.

The precharge circuit 2-3 precharges the complementary bit lines.

Figure 1B:
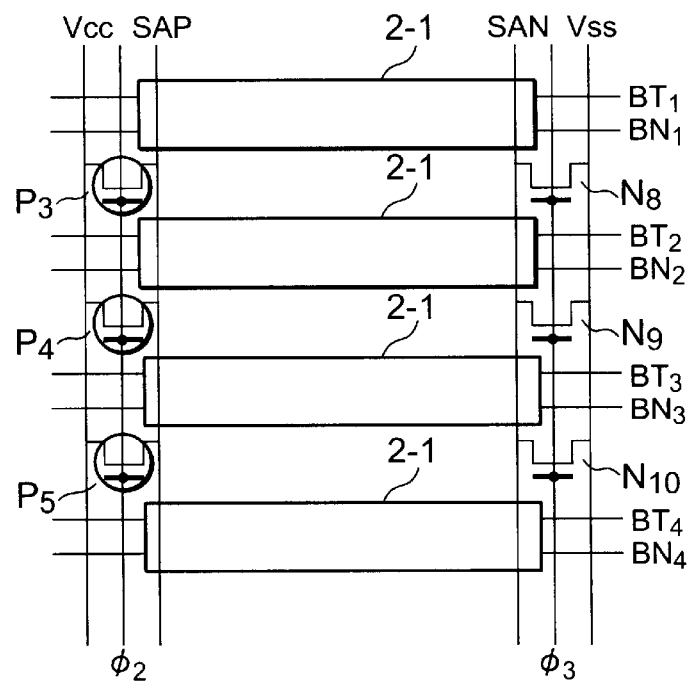

As shown in the circuit diagram of FIG. 1B, there are arranged the sense amplifiers 2-1, Pch MOS transistors P3, P4 and P5 driving the Pch MOS transistors P1, P2 of the sense amplifier, and Nch MOS transistors N8, N9 and N10 driving the Nch MOS transistors N1, N2 of the sense amplifier.

One Pch MOS transistor P3 is provided corresponding to the Pch MOS transistors P1, P2 of the sense amplifier connected to a bit line pair BT1, BN1. One NchMOS transistor N8 is provided corresponding to the Nch MOS transistors N1, N2 of the sense amplifier connected to the bit line pair BT1, BN1.

The sense amplifier transistors of each pair (the Pch MOS transistors P1, P2 and the Nch MOS transistors N1, N2) connected to the complementary bit line pair are provided with the MOS transistor (the Pch MOS transistors P3, P4 and P5 and the Nch MOS transistors N8, N9 and N10) driving the sense amplifier. All electric currents flowing the MOS transistors flow to the individual sense amplifiers. Delay and variation in driving start between the sense amplifiers can be eliminated.

The drains of the Pch MOS transistors P3, P4 and P5 are connected to the SAP and the sources thereof are connected to a Vcc. The Pch MOS transistors P3, P4 and P5 drive the SAP to the Vcc by $\phi 2$. The drains of the Nch MOS transistors N8, N9 and N10 are connected to the SAN and the sources thereof are connected to a Vss. The Nch MOS transistors N8, N9 and N10 drive the SAN to the Vss by $\phi 3$.

The operation of the sense amplifier will be described.

When /RAS (Row Address strobe) of an external control signal is at "H" level, the control signal of $\phi 1$ of the precharge circuit 2-3 is "H". The bit line pair is precharged to Vcc/2.

When the /RAS is changed from the "H" to "L" level and the DRAM is in an active mode, the control signal of $\phi 1$ is "L" in the precharge circuit. The precharge is stopped so as to bring the bit lines into a floating state.

An external input address selects and drives one of word lines (WL1 to WLn). Data of the memory cell of the selected word line is read out to the bit line.

The activating signals $\phi 2$ and $\phi 3$ drive the common source wire SAP of the sense amplifier to the Vcc (source voltage) and the SAN to the Vss (ground voltage). The bit line sense amplifier is activated to sense and amplify a very small potential difference read out to the bit line. The "L" level side of the bit line pair is discharged to the ground potential Vss by the NMOS sense amplifier. The "H" level side of the bit line pair is charged to the source voltage Vcc by the PMOS sense amplifier. The amplified voltage corresponding to the information is outputted outside by turning on the YSW of the IO switch 2-2.

The layout of the sense amplifier 2-1 will be described below by separating the P channel side sense amplifier region and the N channel side sense amplifier region.

Figure 2:
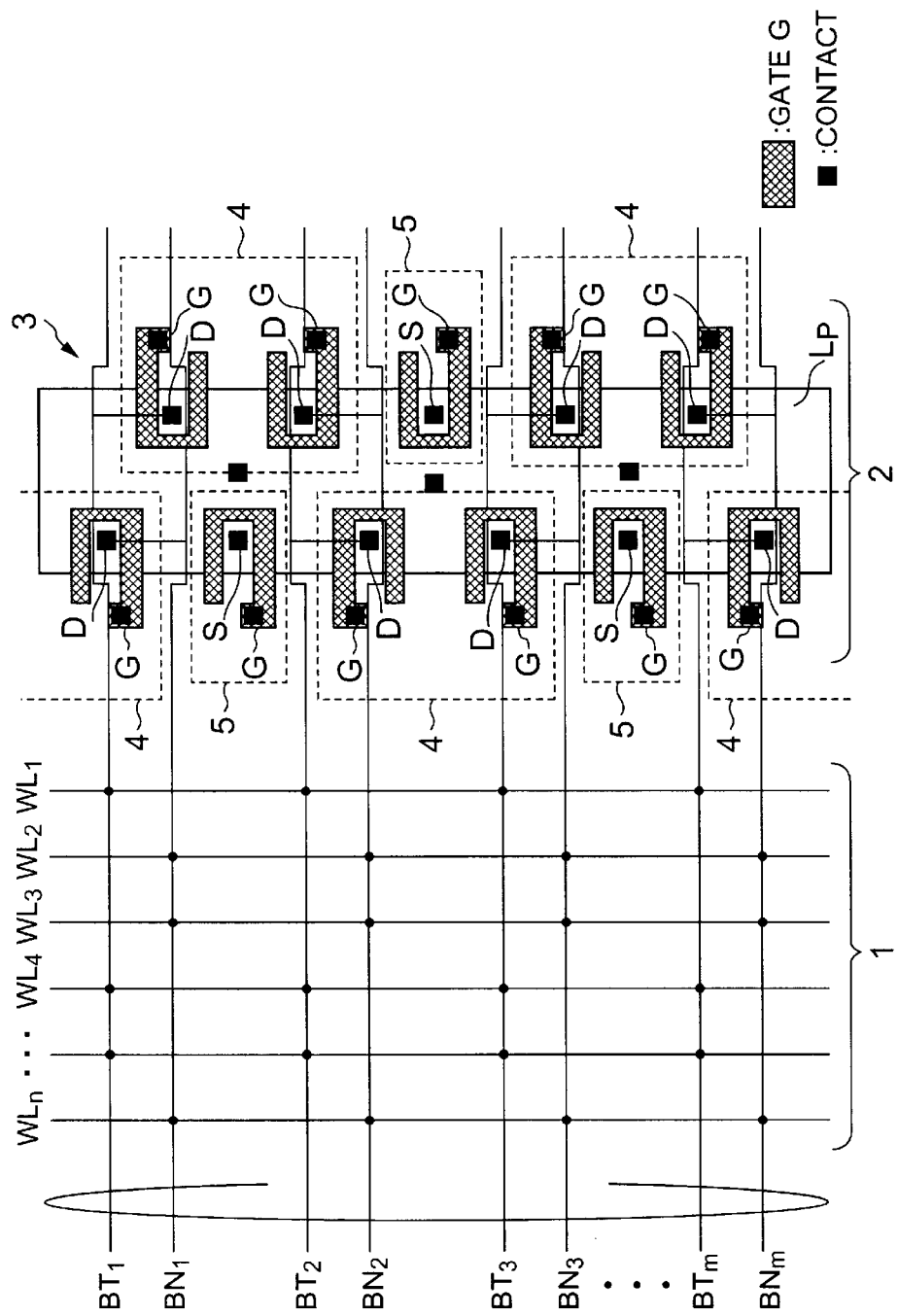
FIG. 2 is a schematic layout showing a P channel side sense amplifier region of a semiconductor memory device of Embodiment 1 of the present invention.

As shown in FIG. 2, the layout of a P channel side sense amplifier region of a semiconductor memory device according to Embodiment 1 has P channel sense amplifier transistors connected to bit lines, and P channel sense amplifier driver transistors 5 driving the P channel sense amplifier transistors. One sense amplifier driver transistor 5 is arranged corresponding to two sense amplifier transistors.

A memory cell array 1 has bit lines (BT1 to BTm, BN1 to BNm), word lines (WL1 to WLn), and memory cells (not shown) arranged in predetermined crossing regions of the bit lines and the word lines.

Gates G of the P channel sense amplifier transistors are U shaped and are formed in two arrays in the bit line direction on a P+ diffusion layer region LP to divide the diffusion region LP into two. The gates G are U shaped and are formed to divide the diffusion region into two. The sources S can be formed to be shared in the diffusion layer region LP.

Of the P channel sense amplifier transistors connected respectively to the complementary bit lines (BT1 to BTm, BN1 to BNm) of the memory cell array, the gates G of the P channel sense amplifier transistor having its gate G connected to the BN1 (its drain D connected to the BT1) and the P channel sense amplifier transistor having its gate G connected to the BT2 (its drain D connected to the BN2) (a pair sense amplifier transistor 4) are arranged in an array far from the memory cell array. The gates G of the P channel sense amplifier transistor having its gate G connected to the BN2 (its drain D connected to the BT2) and the P channel sense amplifier transistor having its gate G connected to the BT3 (its drain D connected to the BN3) (the pair sense amplifier transistor 4) are arranged in an array near the memory cell array 1. In the same manner, the pair sense amplifier transistors 4 are staggered to the center line in the bit line direction of the diffusion layer region LP.

The P channel sense amplifier driver transistor 5 is arranged at the side near the memory cell array 1 between the complementary bit line pairs BT1, BN1 and BT2, BN2. In addition, the P channel sense amplifier driver transistor 5 is arranged at the side far from the memory cell array 1 between the complementary bit line pairs BT2, BN2 and BT3, BN3. In the same manner, the sense amplifier driver transistors 5 are staggered to the center line in the bit line direction of the diffusion layer region LP.

In the above case, the source S of the individual P channel sense amplifier transistors is formed to be shared in the P+ diffusion layer region LP. The drain D of the individual sense amplifier driver transistors 5 is formed to be shared in the P+ diffusion layer region LP.

In the arrangement, the sense amplifier transistors and the sense amplifier driver transistors 5 can be formed on the same diffusion layer region.

The size increase in the word line direction by adding the P channel sense amplifier driver transistors 5 in the word line direction can be absorbed by the pair sense amplifier region. The sense amplifier region 2 can be reduced.

The manufacturing method will be described. The P+ diffusion layer region is formed in part of the sense amplifier region of a silicon substrate by doping an impurity. The gates G (gate poly) of the sense amplifier transistor and the sense amplifier driver transistor 5 are formed. An insulator layer is formed to form a through hole (contact) on the diffusion layer region LP forming the source S of the sense amplifier transistor and on the diffusion layer region LP forming the drain D of the sense amplifier driver transistor 5. A first wire layer (not shown) is used for connection. This is the SAP.

Thereafter, an interlayer insulator layer is formed to form a through hole on the diffusion layer region LP forming the drain D and on the gate G of the sense amplifier transistor, and on the diffusion layer region LP forming the source S and on the gate G of the sense amplifier driver transistor 5. The drain D and the gate G of the sense amplifier transistor are connected to a wire forming the complementary bit lines, e.g., a second wire layer (gate electrode). The source S of the sense amplifier driver transistor is connected to a power wire. The gate G thereof is connected to a wire forming φ2, e.g., a second wire layer.

Figure 3:
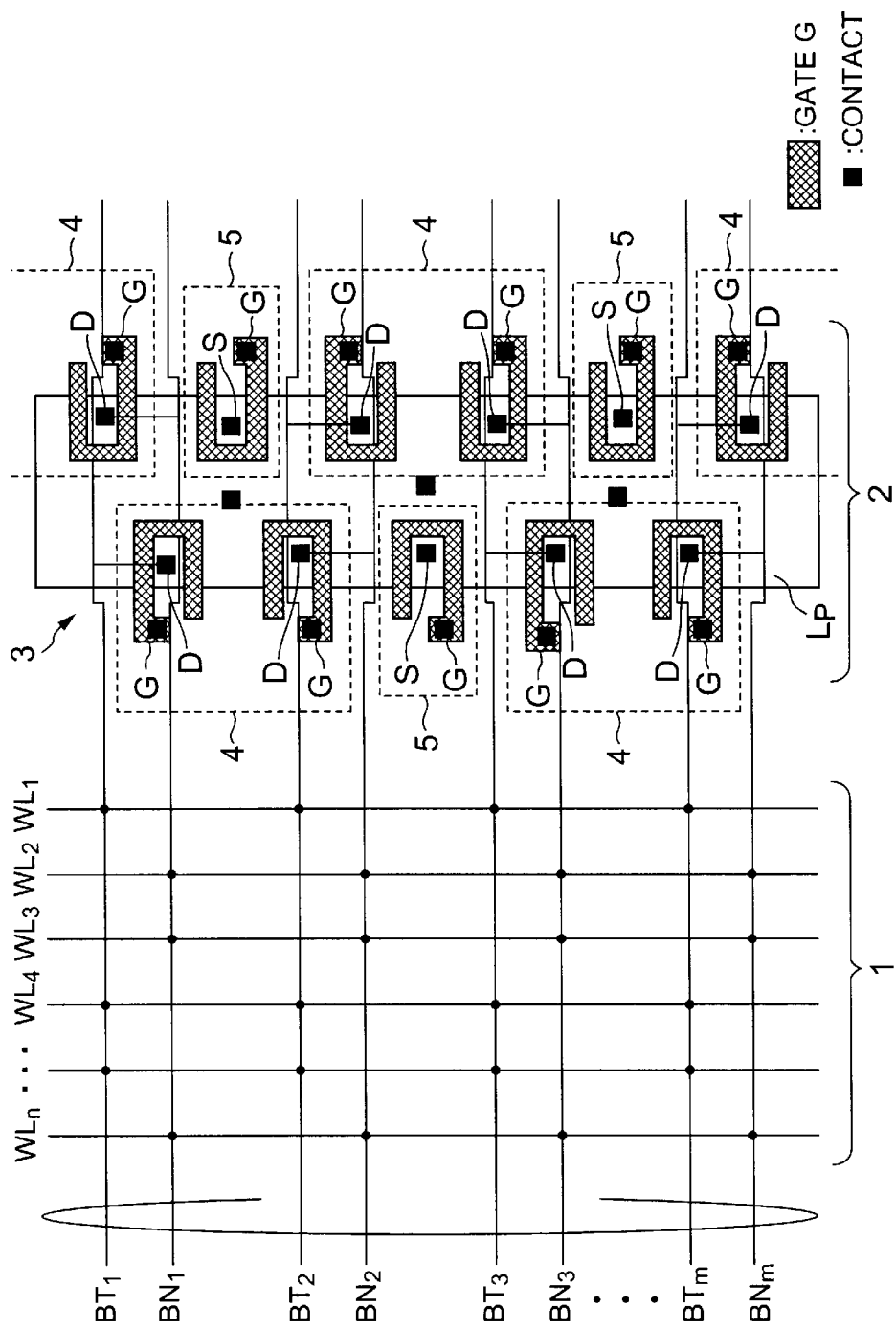
FIG. 3 is another schematic layout showing the P channel side sense amplifier region of the semiconductor memory device of Embodiment 1 of the present invention.

In Embodiment 1, the pair sense amplifier transistor 4 having its gate G connected to the BN1 and BT2 is arranged at the side far from the memory cell array 1, and the P channel sense amplifier driver transistor 5 driving the sense amplifier transistor, e.g., the P channel sense amplifier driver transistor 5 formed between the BN1 and BT2 is arranged at the side near the memory cell array 1. As shown in FIG. 3, the arrangement of the pair sense amplifier transistor 4 and the P channel sense amplifier driver transistor 5 may be reversed.

Figure 4:
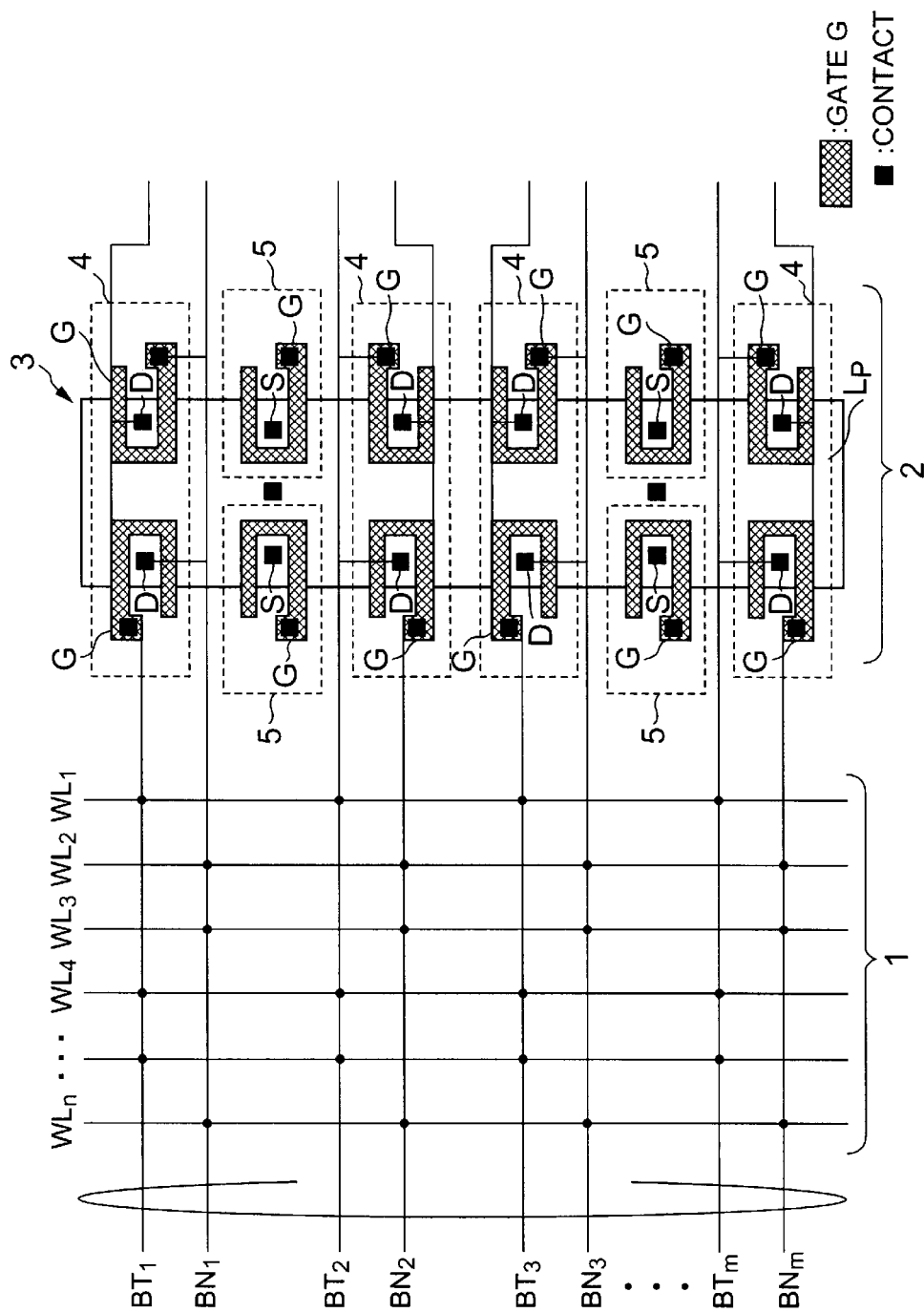
FIG. 4 is a schematic layout showing the P channel side sense amplifier region of the semiconductor memory device of Embodiment 2 of the present invention.

As shown in FIG. 4, the layout of a P channel side sense amplifier region of a semiconductor memory device according to Embodiment 2 has, as in Embodiment 1, P channel sense amplifier transistors connected to bit lines, and P channel sense amplifier driver transistors 5 driving the P channel sense amplifier transistors 4. One sense amplifier driver transistor is arranged corresponding to two sense amplifier transistors. A memory cell array 1 has bit lines (BT1 to BTm, BN1 to BNm), word lines (WL1 to WLn), and memory cells (not shown) arranged in predetermined crossing regions of the bit lines and the word lines. The gates G of the P channel sense amplifier transistors are U shaped and are formed in two arrays in the bit line direction on a P+ diffusion layer region LP to divide the diffusion layer region LP into two.

The gates G are U shaped and are formed to divide the diffusion region into two. The sources S can be formed to be shared in the diffusion layer region LP.

Of the P channel sense amplifier transistors connected respectively to the complementary bit lines (BT1 to BTm, BN1 to BNm) of the memory cell array, the gates G of the P channel sense amplifier transistor having its gate G connected to the BT1 (its drain D connected to the BN1) and the P channel sense amplifier transistor having its gate G connected to the BN1 (its drain D connected to the BT1) (a pair sense amplifier transistor 4) are arranged side by side at the sides near and far from the memory cell array in the bit direction between the bit lines BT1 and BN1. The gates G of the P channel sense amplifier transistor having its gate G connected to the BT2 (its drain D connected to the BN2) and the P channel sense amplifier transistor having its gate G connected to the BN2 (its drain D connected to the BT2) (the pair sense amplifier transistor 4) are arranged side by side at the sides near and far from the memory cell array in the bit direction between the bit lines BT2 and BN2. In the same manner, the pair sense amplifier transistors 4 are arranged in the word line direction of the diffusion layer region LP.

The P channel sense amplifier driver transistors 5 are arranged side by side in the bit direction at the sides near and far from the memory cell array 1 between the complementary bit line pairs BT1, BN1 and BT2, BN2. In addition, the P channel sense amplifier driver transistors 5 are arranged side by side at the sides near and far from the memory cell array 1 in the bit line direction between the complementary bit line pairs BT3, BN3 and BT4, BN4 (not shown). In the same manner, the sense amplifier driver transistors 5 are arranged in the word line direction on the diffusion layer region LP.

In the above case, the source S of the individual P channel sense amplifier transistors is formed to be shared in the P+ diffusion layer region LP. The drain D of the individual sense amplifier driver transistors 5 is formed to be shared in the P+ diffusion layer region LP.

In the arrangement, the sense amplifier transistors and the sense amplifier driver transistors 5 can be formed on the same diffusion layer region.

The P channel sense amplifier driver transistors 5 are arranged in the word line direction. The size is not increased in the bit line direction.

The sense amplifier region 2 can be reduced.

The manufacturing method is the same as Embodiment 1.

Figure 5:
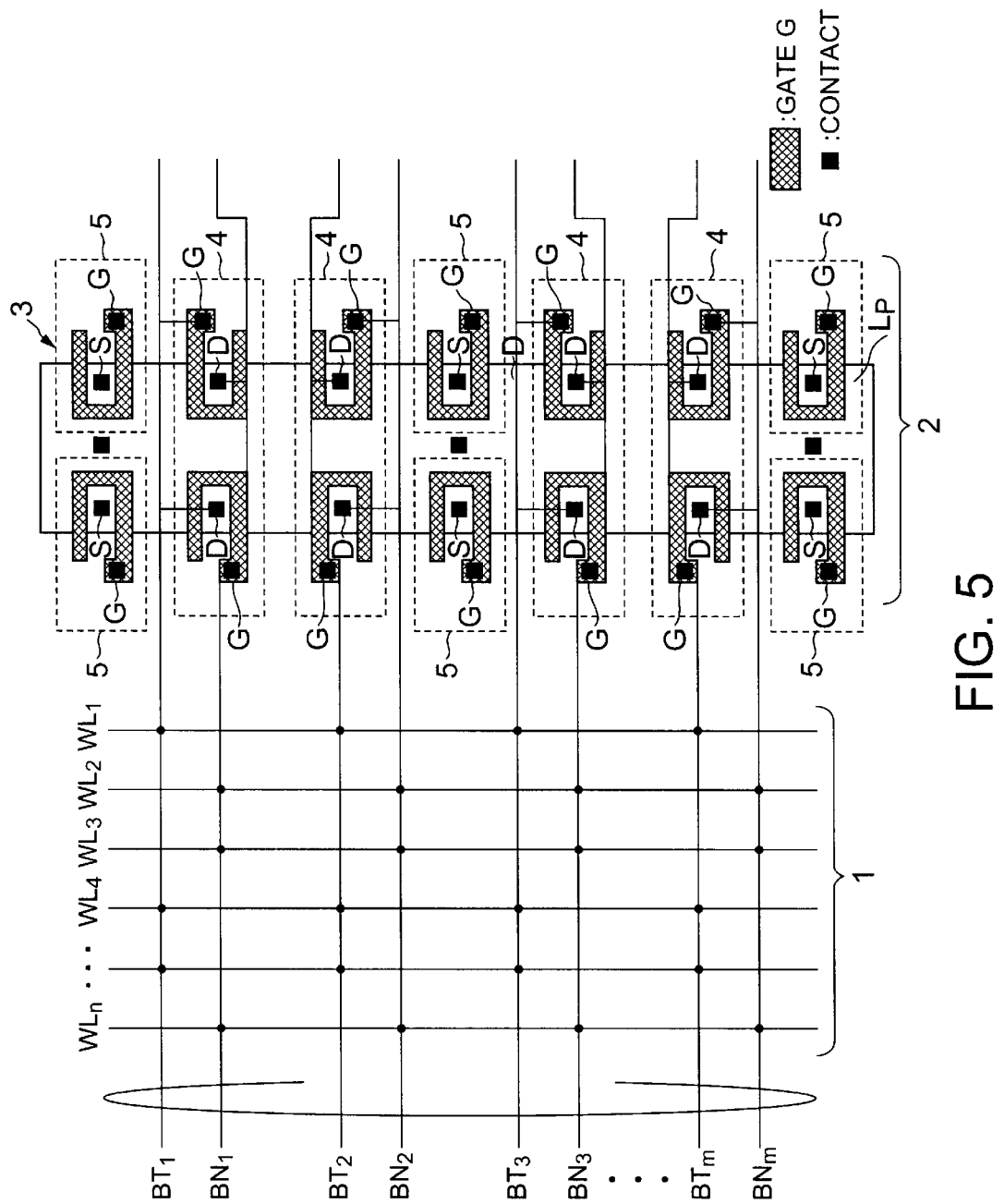
FIG. 5 is another schematic layout showing the P channel side sense amplifier region of the semiconductor memory device of Embodiment 2 of the present invention.

In Embodiment 2, the gates G of the pair sense amplifier transistor 4 having its gate G connected to the BT1 and BN1 is arranged side by side in the bit line direction at the sides near and far from the memory cell array between the bit lines BT1 and BN1, and the sense amplifier driver transistors 5 are arranged side by side in the bit line direction at the sides near and far from the memory cell array 1 between the complementary bit line pairs BT1, BN1 and BT2, BN2. As shown in FIG. 5, the arrangement positions of the sense amplifier driver transistors 5 may be shifted and arranged side by side in the bit line direction at the sides near and far from the memory cell array 1 between the complementary bit line pairs BT2, BN2 and BT3, BN3.

Figure 6:
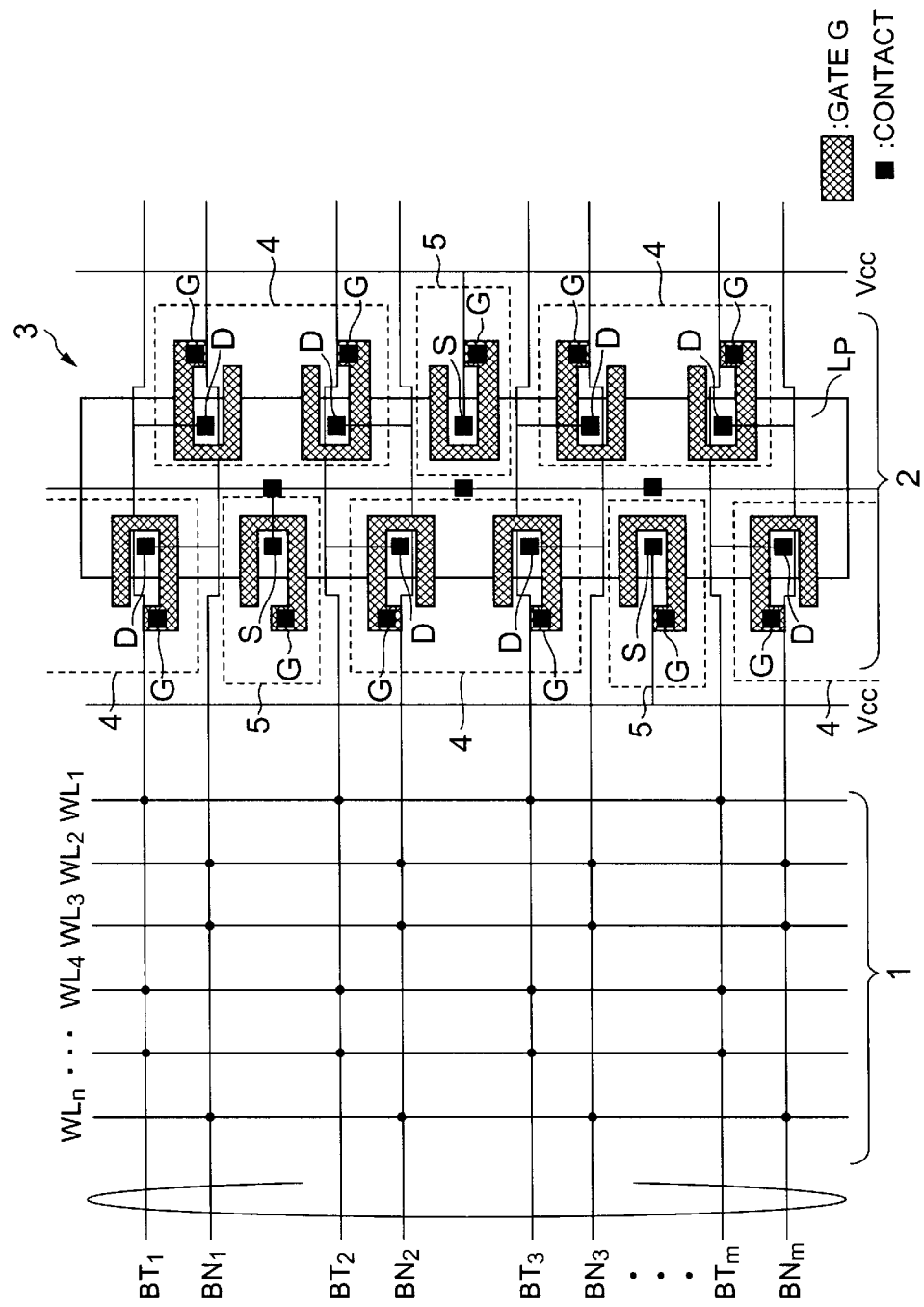
FIG. 6 is a schematic layout showing the P channel side sense amplifier region of the semiconductor memory device of Embodiment 3 of the present invention.

As shown in FIG. 6, the layout of a P channel side sense amplifier region of a semiconductor memory device according to Embodiment 3 has, in Embodiment 1, a construction in which the drain D and the source S of at least one of one or more sense amplifier driver transistors are connected.

There are connected the source S and the drain D of a P channel sense amplifier driver transistor 5 arranged between the bit line pairs BT1, BN1 and BT2, BN2 driving the sense amplifier transistor connected to the BT1 and BN1.

The sense amplifier transistor connected to the BT1 and BN1 is not operated. The drive ability of the entire sense amplifier driver transistor can be controlled to reduce the power consumption.

The operation of the P channel sense amplifier driver transistor is the same as the above operation except that the sense amplifier driven by the P channel sense amplifier driver transistor in which its source S and drain D are connected is not driven.

The manufacturing method is the same as Embodiment 1 except that a wire layer connecting the source S of at least one of the sense amplifier driver transistors and the SAP is formed.

Figure 7:
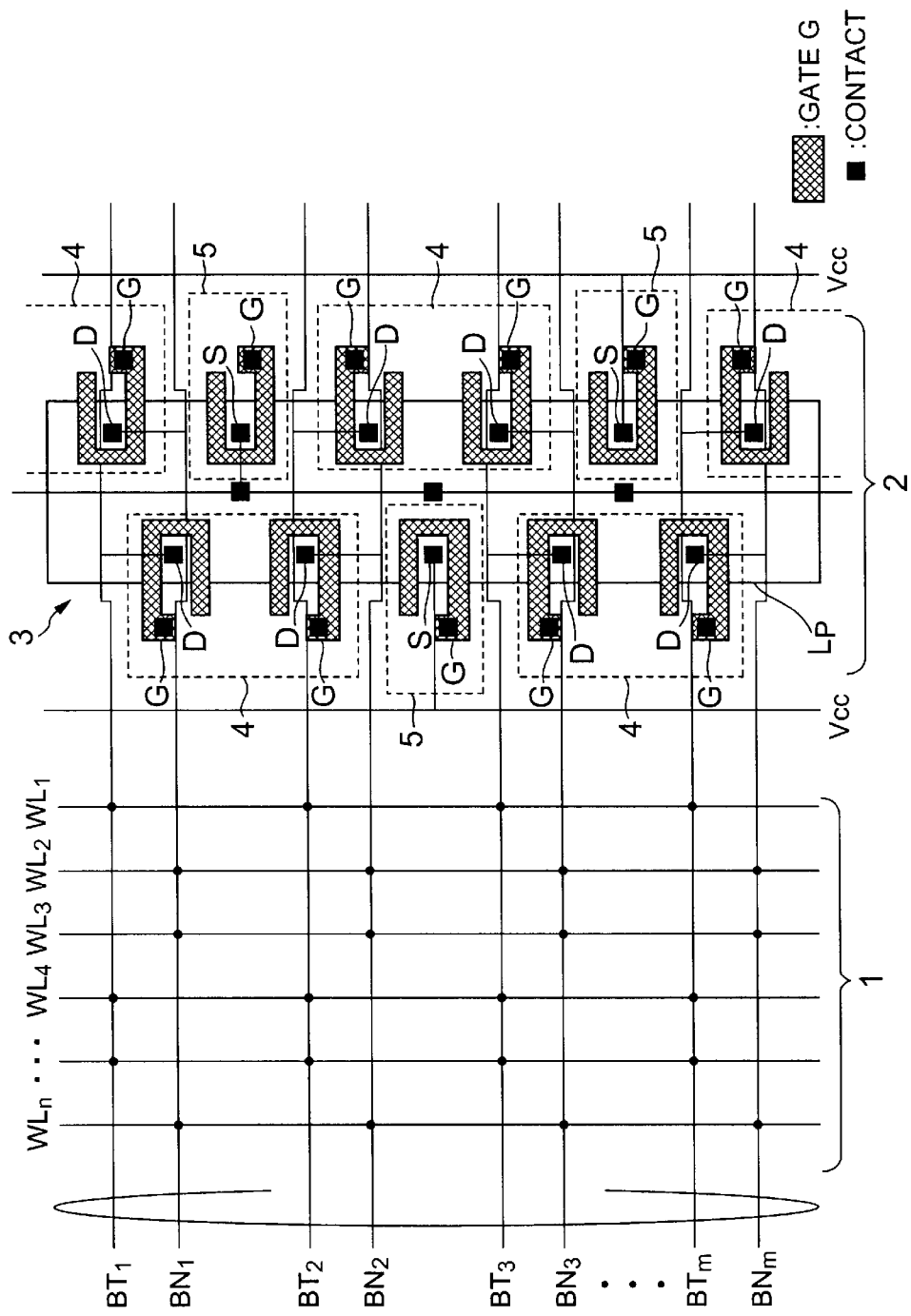
FIG. 7 is another schematic layout showing the P channel side sense amplifier region of the semiconductor memory device of Embodiment 3 of the present invention.

Corresponding to FIG. 3 of Embodiment 1, the arrangement of a pair sense amplifier transistor 4 and the sense amplifier driver transistor 5 is reversed. As shown in FIG. 7, there are connected the source S and the drain D of the P channel sense amplifier driver transistor 5 driving the sense amplifier transistor connected to the BT1 and BN1. The sense amplifier driver transistor can be off all the time. The drive ability of the entire sense amplifier driver transistor can be controlled to reduce the power consumption.

Figure 8:
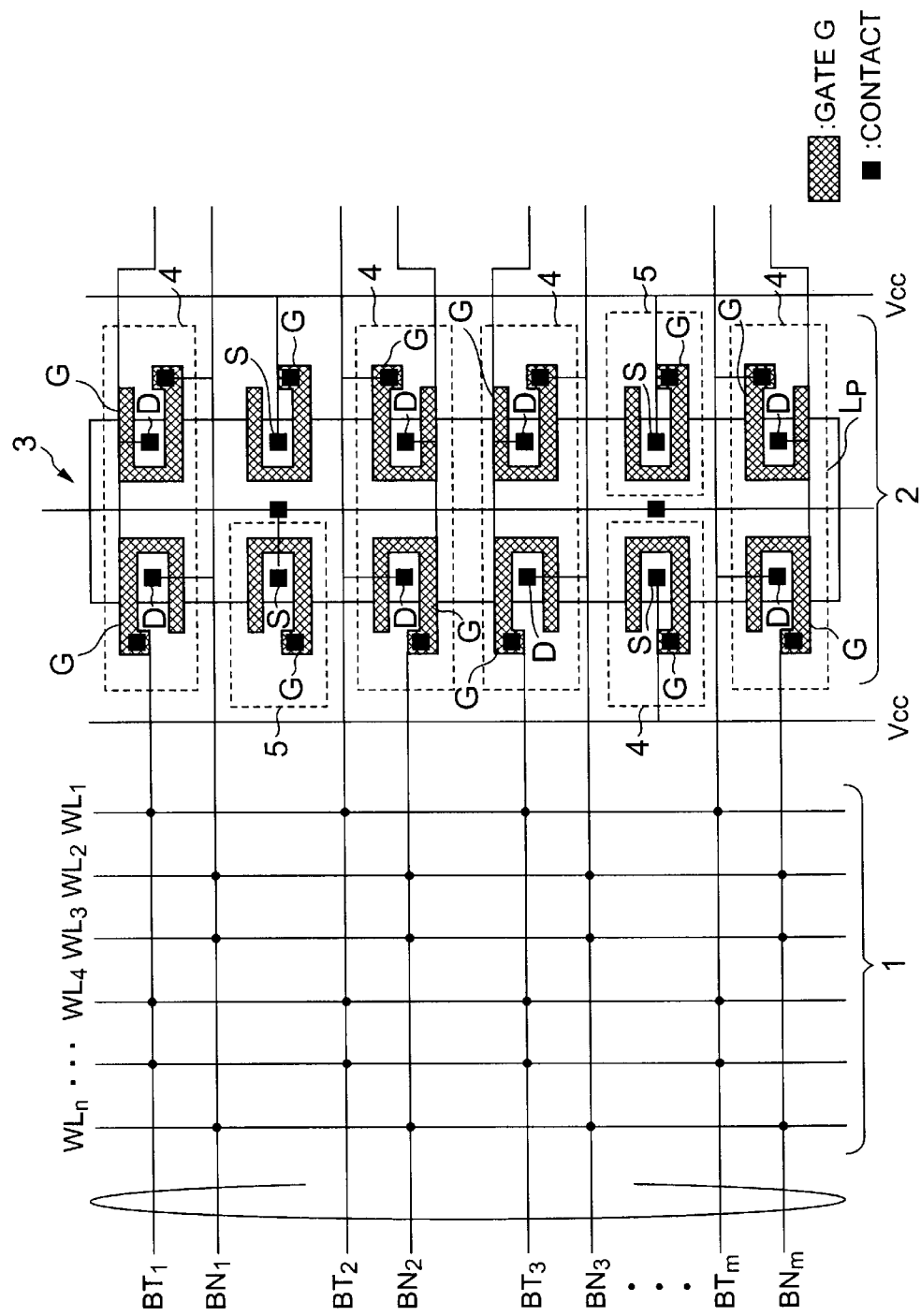
FIG. 8 is a schematic layout showing the P channel side sense amplifier region of the semiconductor memory device of Embodiment 4 of the present invention.

As shown in FIG. 8, the layout of a P channel side sense amplifier region of a semiconductor memory device according to Embodiment 4 has, in Embodiment 2, a construction in which the drain D and the source S of at least one of one or more sense amplifier driver transistors are connected.

There are connected the source S and the drain D of a P channel sense amplifier driver transistor 5 (the P channel sense amplifier driver transistor 5 arranged between the bit line pairs BT1, BN1 and BT2, BN2) driving the sense amplifier transistor connected to the BT1 and BN1.

The sense amplifier transistor connected to the BT1 and BN1 is not operated. The drive ability of the entire sense amplifier driver transistor can be controlled to reduce the power consumption.

The operation of the P channel sense amplifier driver transistor is the same as the above operation except that the sense amplifier driven by the P channel sense amplifier driver transistor in which its source S and drain D are connected is not driven.

The manufacturing method is the same as Embodiment 3.

Figure 9:
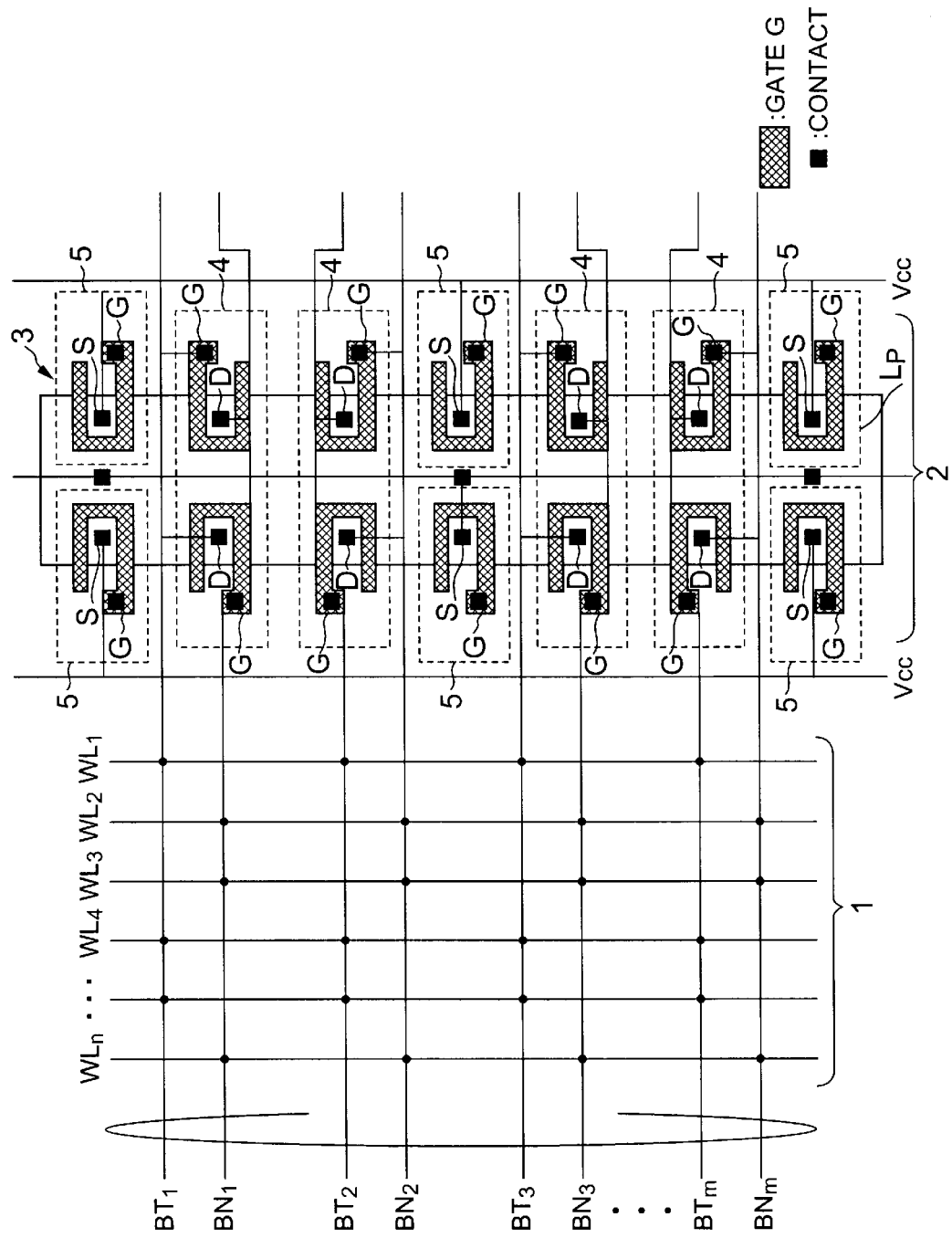
FIG. 9 is another schematic layout showing the P channel side sense amplifier region of the semiconductor memory device of Embodiment 4 of the present invention.

Corresponding to FIG. 5 of Embodiment 2, the arrangement position of the pair sense amplifier driver transistor 5 is shifted. As shown in FIG. 9, there can be connected the source S and the drain D of the P channel sense amplifier driver transistor 5 driving a pair sense amplifier transistor 4 connected to the BT2 and BN2. The drive ability of the entire sense amplifier driver transistor can be controlled to reduce the power consumption.

Figure 10:
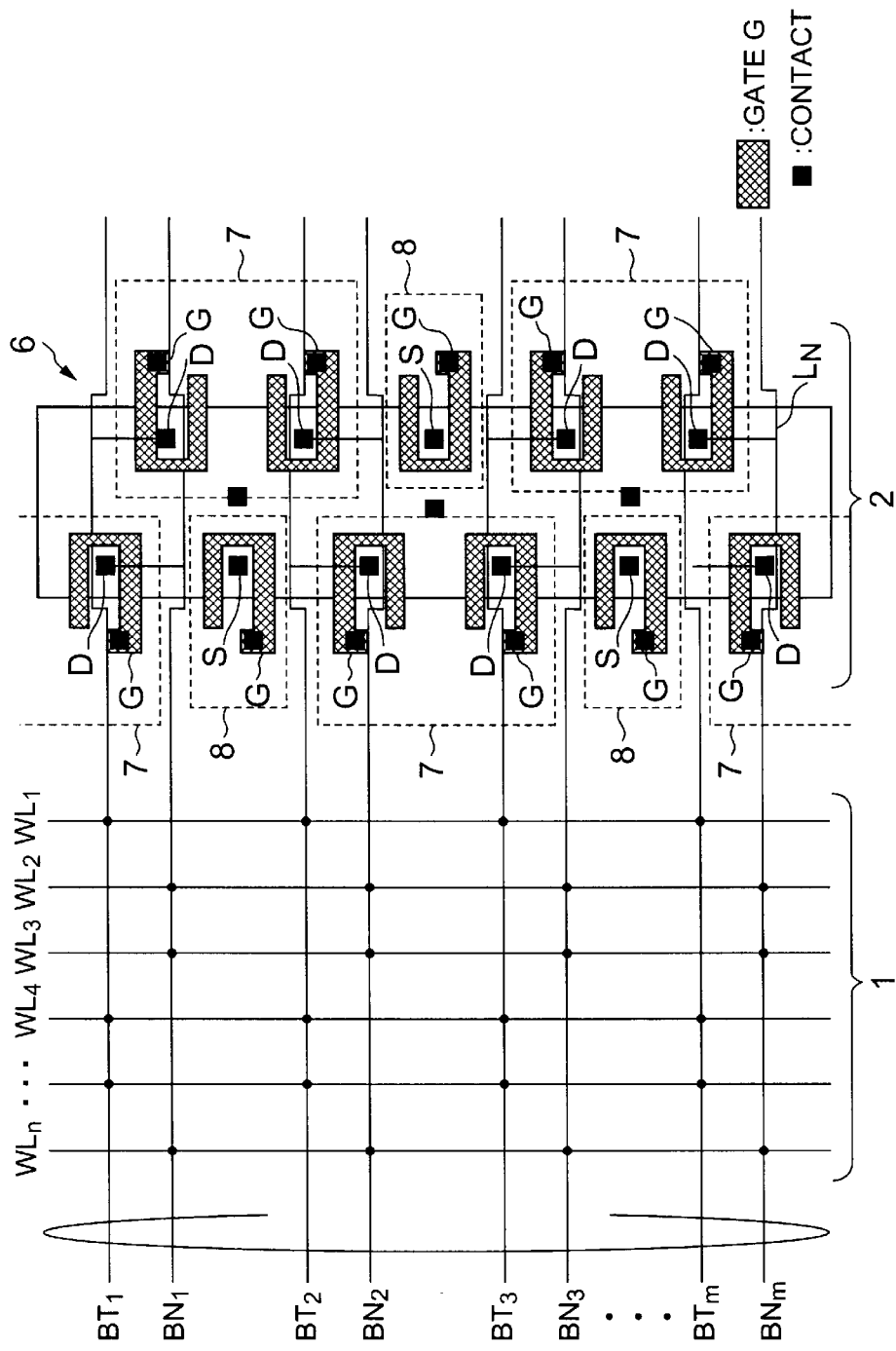
FIG. 10 is a schematic layout showing the N channel side sense amplifier region of the semiconductor memory device of Embodiment 5 of the present invention.

As shown in FIG. 10, the layout of an N channel side sense amplifier region 6 of a semiconductor memory device according to Embodiment 5 has N channel sense amplifier transistors connected to bit lines, and N channel sense amplifier driver transistors 8 driving the N channel sense amplifier transistors. One sense amplifier driver transistor is arranged corresponding to two sense amplifier transistors. A memory cell array 1 has bit lines (BT1 to BTm, BN1 to BNm), word lines (WL1 to WLn), and memory cells (not shown) arranged in predetermined crossing regions of the bit lines and the word lines.

The gates G of the N channel sense amplifier transistors are U shaped and are formed in two arrays in the bit line direction on a N+ diffusion layer region LN to divide the diffusion region into two.

The gates G are U shaped and are formed to divide the diffusion region into two. The sources S can be formed to be shared in the diffusion layer region LN.

Of the N channel sense amplifier transistors connected respectively to the complementary bit lines (BT1 to BTm, BN1 to BNm) of the memory cell array, the gates G of the N channel sense amplifier transistor having its gate G connected to the BN1 (its drain D connected to the BT1) and the N channel sense amplifier transistor having its gate G connected to the BT2 (its drain D connected to the BN2) (a pair sense amplifier transistor 7) are arranged in an array far from the memory cell array. The gates G of the N channel sense amplifier transistor having its gate G connected to the BN2 (its drain D connected to the BT2) and the N channel sense amplifier transistor having its gate G connected to the BT3 (its drain D connected to the BN3) (the pair sense amplifier transistor 7) are arranged in an array near the memory cell array 1. In the same manner, the pair sense amplifier transistors 7 are staggered to the center line in the bit line direction of the diffusion layer region LN.

The N channel sense amplifier driver transistor 8 is arranged at the side near the memory cell array 1 between the complementary bit line pairs BT1, BN1 and BT2, BN2. In addition, the N channel sense amplifier driver transistor 8 is arranged at the side far from the memory cell array 1 between the complementary bit line pairs BT2, BN2 and BT3, BN3. In the same manner, the sense amplifier driver transistors 8 are staggered to the center line in the bit line direction of the diffusion layer region LN.

In the above case, the source S of the individual N channel sense amplifier transistors is formed to be shared in the N+ diffusion layer region LN. The drain D of the individual sense amplifier driver transistors 5 is formed to be shared in the N+ diffusion layer region LN.

In the arrangement, the sense amplifier transistors and the sense amplifier driver transistors can be formed on the same diffusion layer region LN.

The size increase in the word line direction by adding the N channel sense amplifier driver transistors 5 in the word line direction can be absorbed by the pair sense amplifier region. The sense amplifier region 2 can be reduced.

The manufacturing method will be described. The N+ diffusion layer region is formed in part of the sense amplifier region of a silicon substrate by doping an impurity. The gates G of the sense amplifier transistor and the sense amplifier driver transistor are formed. An insulator layer is formed to form a through hole on the diffusion layer region LN forming the source S of the sense amplifier transistor and on the diffusion layer region LN forming the drain D of the sense amplifier driver transistor. A first wire layer (not shown) is used for connection. This is the SAN.

Thereafter, an interlayer insulator layer is formed to form a through hole on the diffusion layer region LN forming the drain D and on the gate G of the sense amplifier transistor, and on the diffusion layer region LN forming the source S and on the gate G of the sense amplifier driver transistor 8. The drain D and the gate G of the sense amplifier transistor are connected to a second wire layer forming the complementary bit lines. The source S of the sense amplifier driver transistor 8 is connected to a power wire. The gate G thereof is connected to a second wire layer forming φ2.

Figure 11:
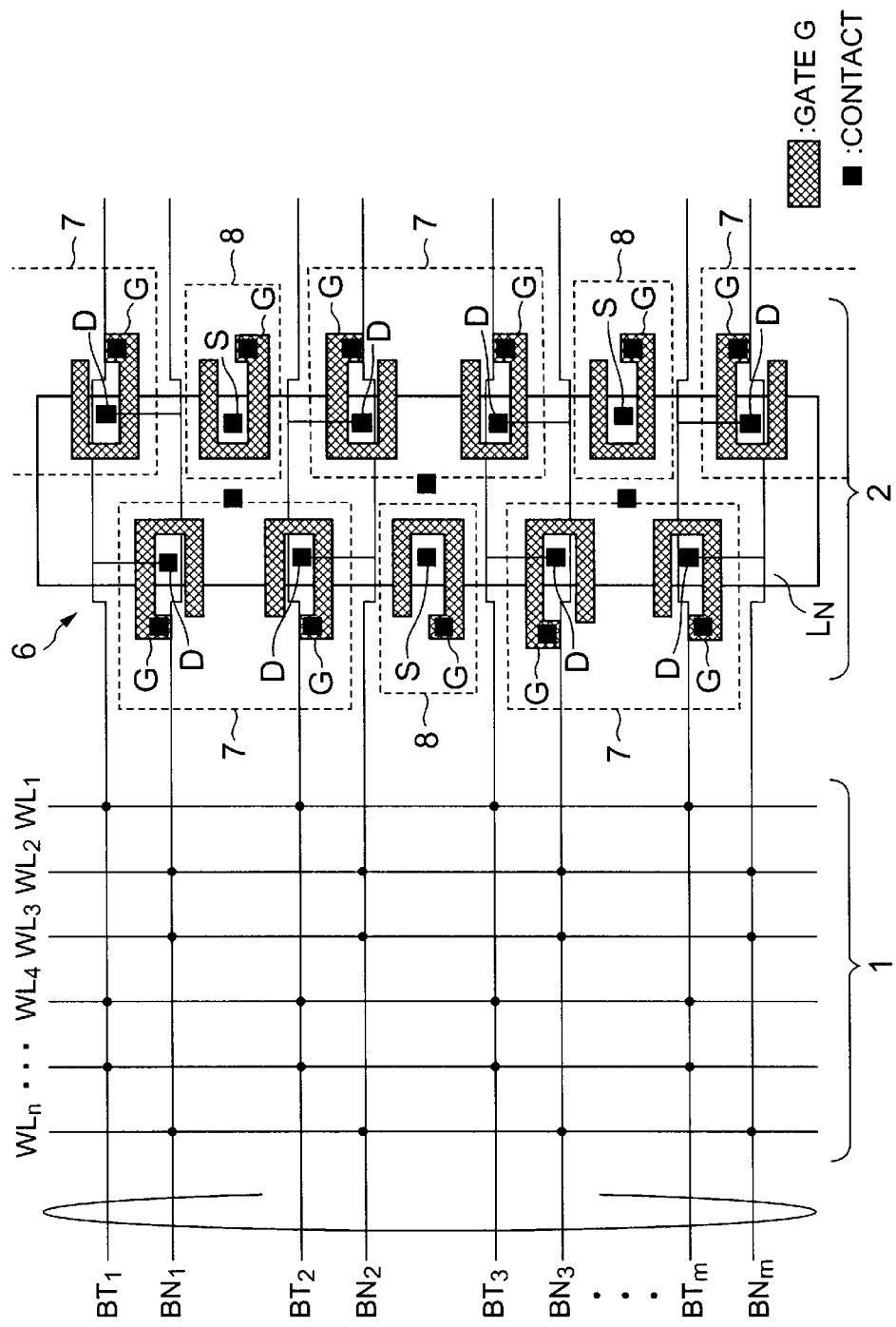
FIG. 11 is another schematic layout showing the N channel side sense amplifier region of the semiconductor memory device of Embodiment 5 of the present invention.

In Embodiment 5, the pair sense amplifier transistor 7 having its gate G connected to the BN1 and BT2 is arranged at the side far from the memory cell array 1, and the N channel sense amplifier driver transistor 8 driving the sense amplifier transistor, e.g., the N channel sense amplifier driver transistor 8 formed between the BN1 and BT2 is arranged at the side near the memory cell array 1. As shown in FIG. 11, the arrangement of the pair sense amplifier transistor 4 and the N channel sense amplifier driver transistor 5 may be reversed.

Figure 12:
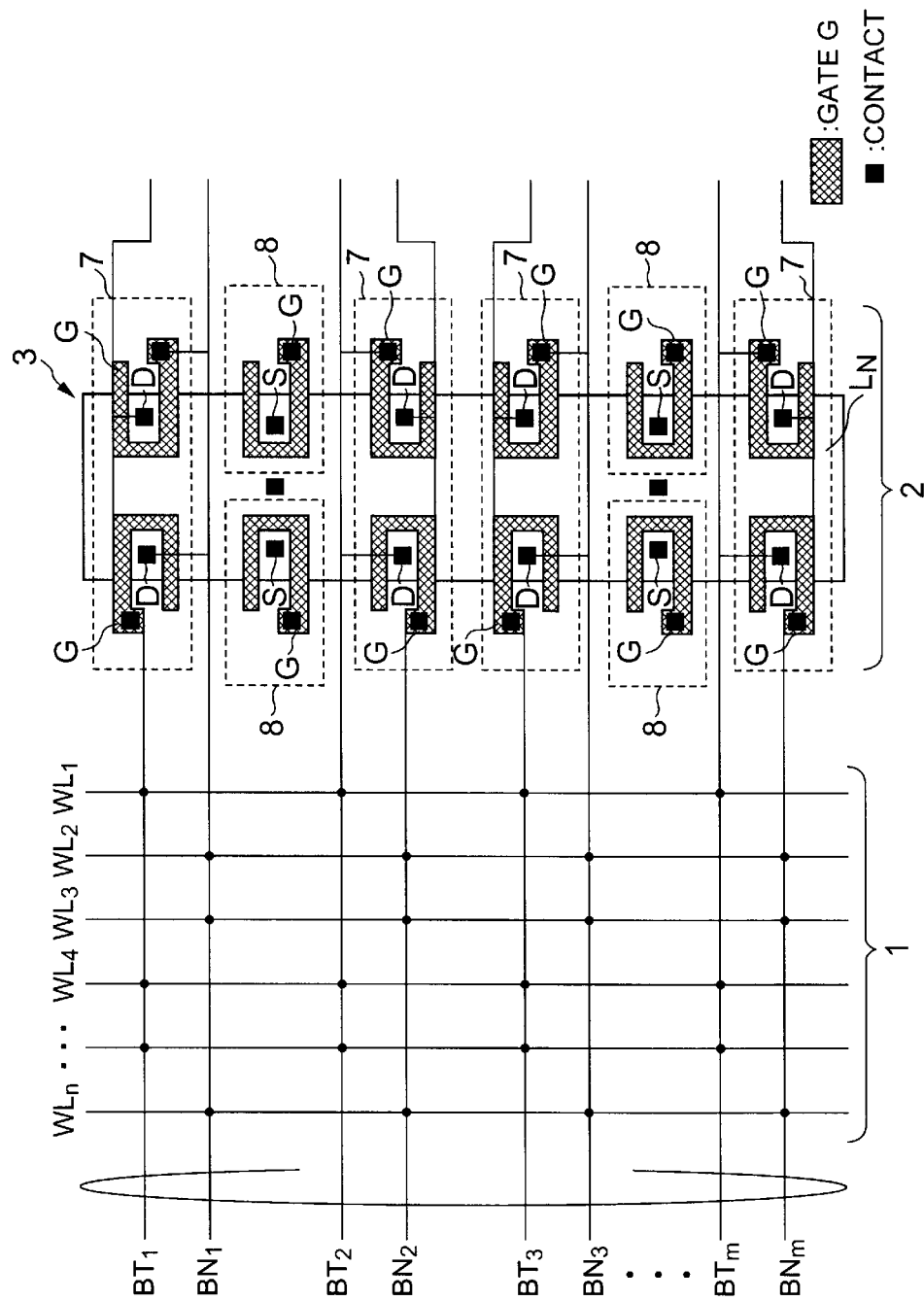
FIG. 12 is a schematic layout showing the N channel side sense amplifier region of the semiconductor memory device of Embodiment 6 of the present invention.

As shown in FIG. 12, the layout of a N channel side sense amplifier region of a semiconductor memory device according to Embodiment 6 has, as in Embodiment 5, N channel sense amplifier transistors connected to bit lines, and N channel sense amplifier driver transistors 8 driving the N channel sense amplifier transistors 4. One sense amplifier driver transistor is arranged corresponding to two sense amplifier transistors.

A memory cell array 1 has bit lines (BT1 to BTm, BN1 to BNm), word lines (WL1 to WLn), and memory cells (not shown) arranged in predetermined crossing regions of the bit lines and the word lines. The gates G of the N channel sense amplifier transistors are U shaped and are formed in two arrays in the bit line direction on a N+ diffusion layer region LN to divide the diffusion layer region into two.

The gates G are U shaped and are formed to divide the diffusion region into two. The sources S can be formed to be shared in the diffusion layer region LN.

Of the N channel sense amplifier transistors connected respectively to the complementary bit lines (BT1 to BTm, BN1 to BNm) of the memory cell array, the gates G of the N channel sense amplifier transistor having its gate G connected to the BT1 (its drain D connected to the BN1) and the N channel sense amplifier transistor having its gate G connected to the BN1 (its drain D connected to the BT1) (a pair sense amplifier transistor 7) are arranged side by side in the bit direction at the sides near and far from the memory cell array between the bit lines BT1 and BN1. The gates G of the N channel sense amplifier transistor having its gate G connected to the BT2 (its drain D connected to the BN2) and the N channel sense amplifier transistor having its gate G connected to the BN2 (its drain D connected to the BT2) (the pair sense amplifier transistor 7) are arranged side by side in the bit direction at the sides near and far from the memory cell array between the bit lines BT2 and BN2. In the same manner, the pair sense amplifier transistors 7 are arranged in the word line direction of the diffusion layer region LN.

The N channel sense amplifier driver transistors 8 are arranged side by side in the bit direction at the sides near and far from the memory cell array 1 between the complementary bit line pairs BT1, BN1 and BT2, BN2. In addition, the N channel sense amplifier driver transistors 8 are arranged side by side in the bit line direction at the sides near and far from the memory cell array 1 between the complementary bit line pairs BT3, BN3 and BT4, BN4 (not shown). In the same manner, the sense amplifier driver transistors 8 are arranged in the Word line direction on the diffusion layer region LN.

In the above case, the source S of the individual N channel sense amplifier transistors 7 is formed to be shared in the N+ diffusion layer region LN. The drain D of the individual sense amplifier driver transistors 8 is formed to be shared in the N+ diffusion layer region LN.

In the arrangement, the sense amplifier transistors and the sense amplifier driver transistors 8 can be formed on the same diffusion layer region.

The N channel sense amplifier driver transistors 8 are arranged in the word line direction. The size is not increased in the bit line direction.

The sense amplifier region 2 can be reduced.

The manufacturing method is the same as Embodiment 5.

Figure 13:
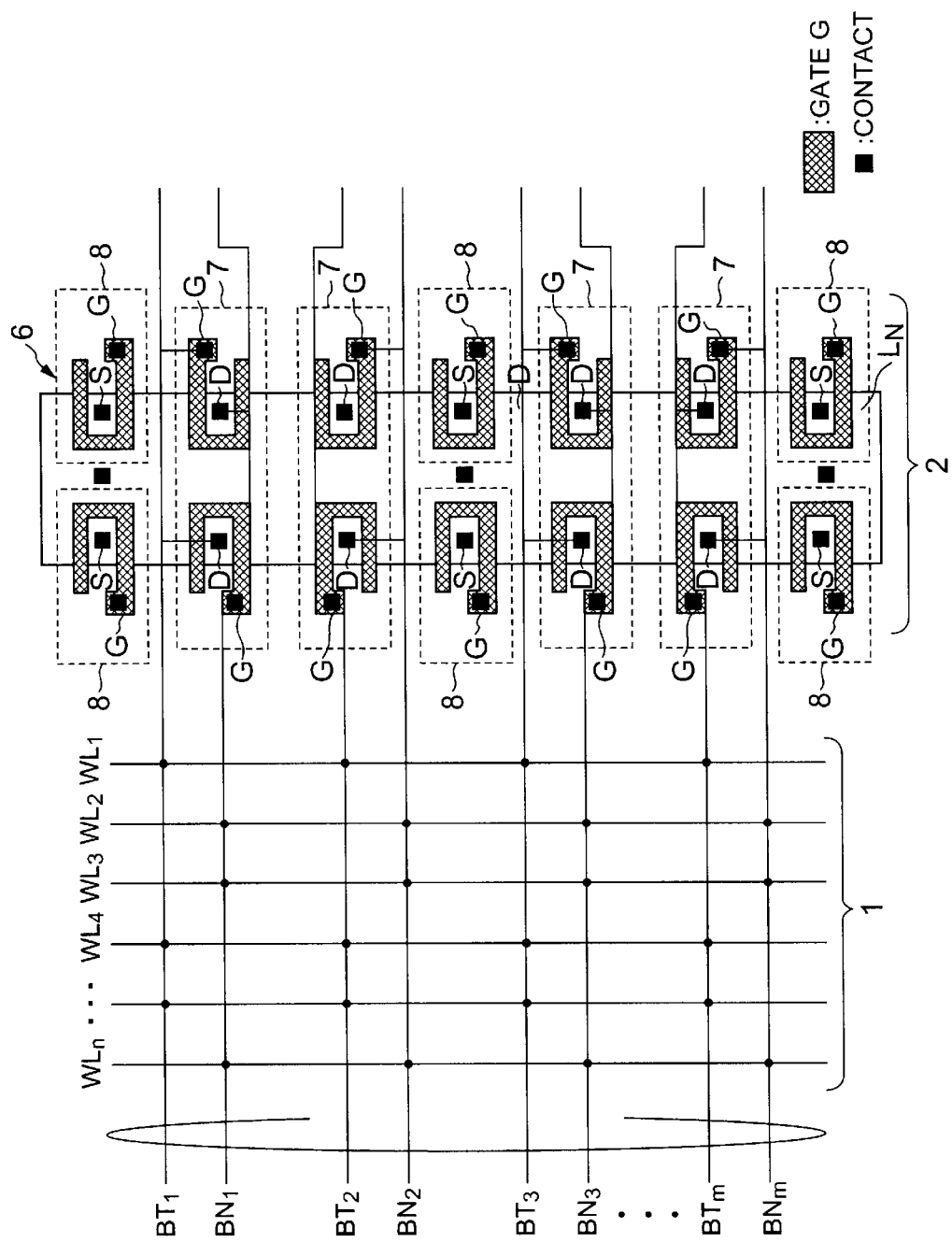
FIG. 13 is another schematic layout showing the N channel side sense amplifier region of the semiconductor memory device of Embodiment 6 of the present invention.

In Embodiment 6, the gates G of the pair sense amplifier transistor 7 having its gate G connected to the BT1 and BN1 are arranged side by side in the bit line direction at the sides near and far from the memory cell array between the bit lines BT1 and BN1, and the sense amplifier driver transistors 8 are arranged side by side in the bit line direction at the sides near and far from the memory cell array 1 between the complementary bit line pairs BT1, BN1 and BT2, BN2. As shown in FIG. 13, the arrangement positions of the sense amplifier driver transistors 8 may be shifted and arranged side by side in the bit line direction at the sides near and far from the memory cell array 1 between the complementary bit line pairs BT2, BN2 and BT3, BN3.

Figure 14:
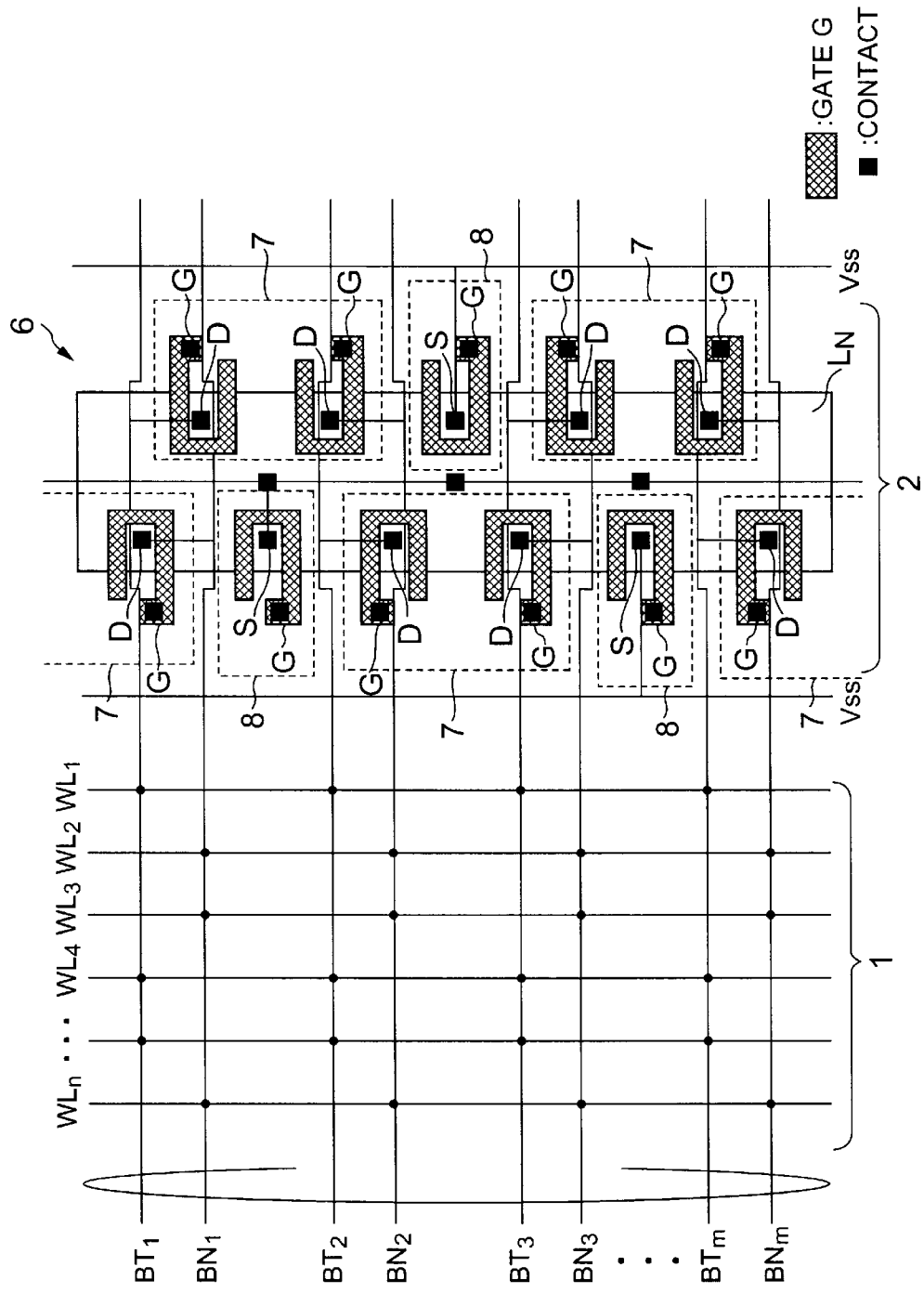
FIG. 14 is a schematic layout showing the N channel side sense amplifier region of the semiconductor memory device of Embodiment 7 of the present invention.

As shown in FIG. 14, the layout of an N channel side sense amplifier region of the semiconductor memory device according to Embodiment 7 has, in Embodiment 5, a construction in which the drain D and the source S of at least one of one or more sense amplifier driver transistors are connected.

There are connected the source S and the drain D of an N channel sense amplifier driver transistor 8 arranged between the bit line pairs BT1, BN1 and BT2, BN2 driving the sense amplifier transistor having its gate G connected to the BT1 and BN1.

The sense amplifier transistor connected to the BT1 and BN1 is not operated. The drive ability of the entire sense amplifier driver transistor can be controlled to reduce the power consumption.

The operation of the N channel sense amplifier driver transistor is the same as the above operation except that the sense amplifier driven by the N channel sense amplifier driver transistor in which its source S and drain D are connected is not driven.

Figure 15:
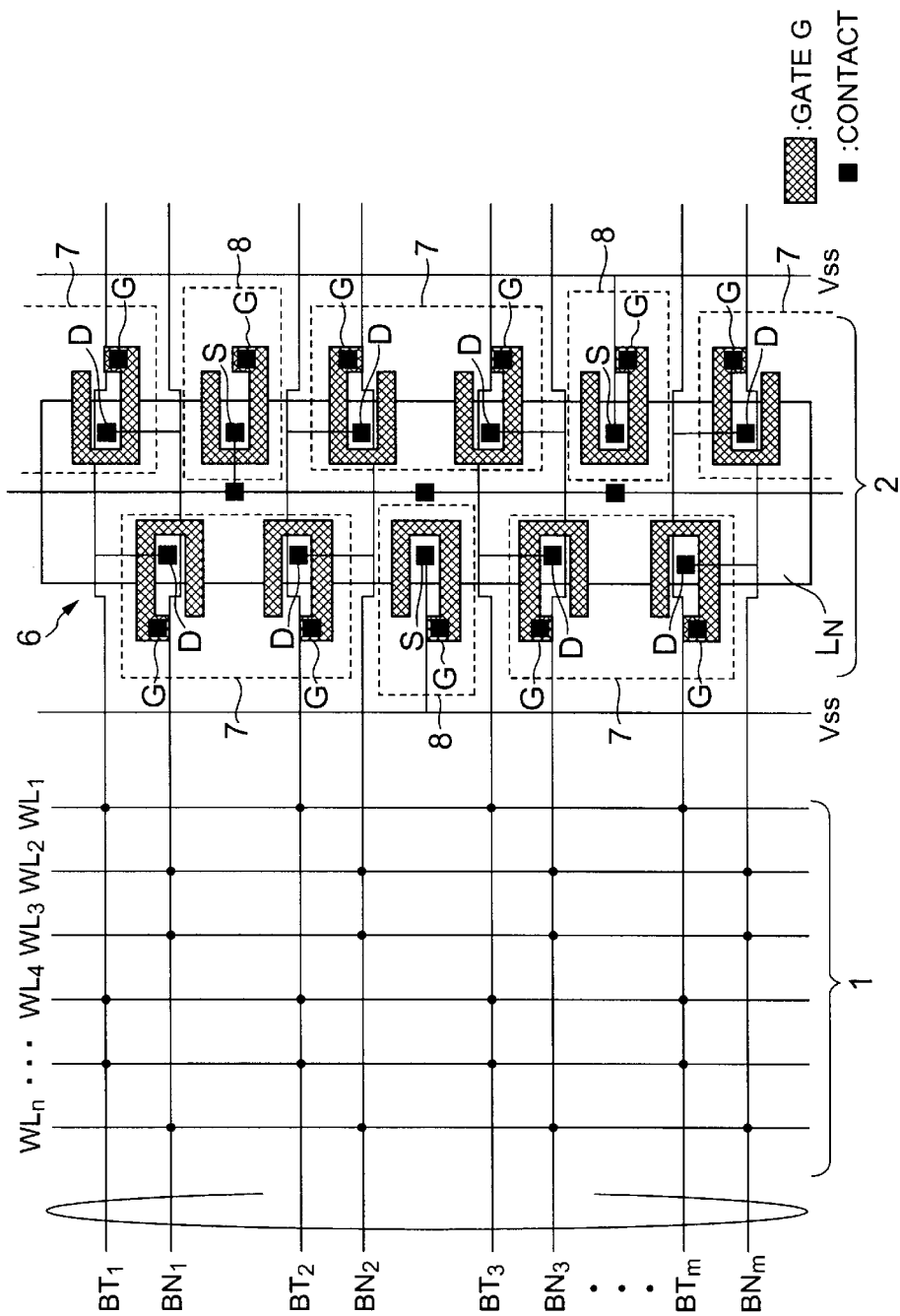
FIG. 15 is another schematic layout showing the N channel side sense amplifier region of the semiconductor memory device of Embodiment 7 of the present invention.

Corresponding to FIG. 11 of Embodiment 5, the arrangement of a pair sense amplifier transistor 7 and the sense amplifier driver transistor 8 is reversed. As shown in FIG. 15, there are connected the source S and the drain D of the sense amplifier driver transistor 8 formed between the BN1 and BT2 driving the sense amplifier transistor connected to the BT1 and BN1. The sense amplifier driver transistor 8 can be off all the time. The drive ability of the entire sense amplifier driver transistor can be controlled to reduce the power consumption.

The manufacturing method is the same as Embodiment 6 except that a wire layer connecting the source S of at least one of the sense amplifier driver transistors and the SAN is formed.

Figure 16:
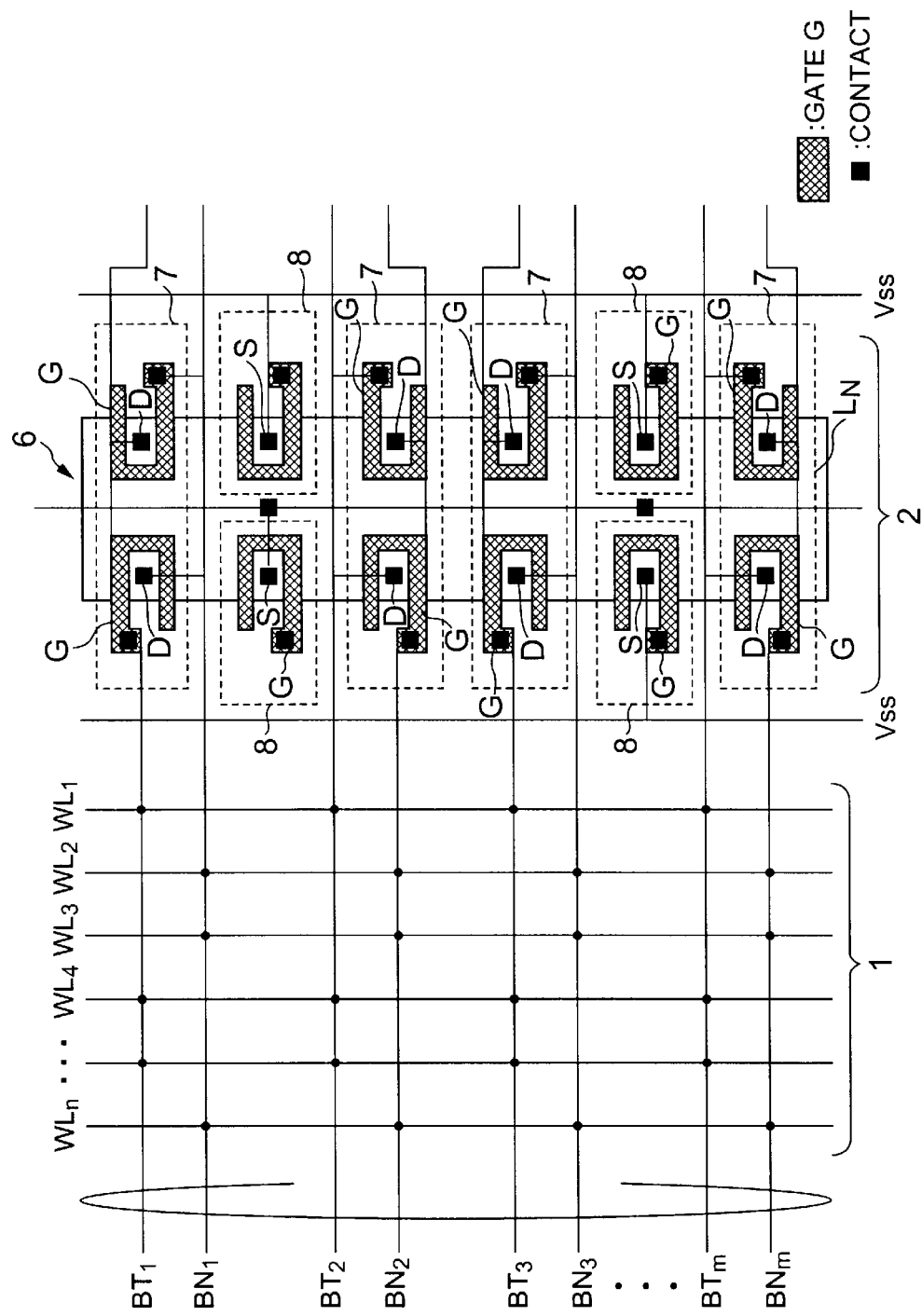
FIG. 16 is a schematic layout showing the N channel side sense amplifier region of the semiconductor memory device of Embodiment 8 of the present invention.

As shown in FIG. 16, the layout of an N channel side sense amplifier region of a semiconductor memory device according to Embodiment 8 has, in Embodiment 6, a construction in which the drain D and the source S of at least one of one or more sense amplifier transistors are connected.

There are connected the source S and the drain D of an N channel sense amplifier driver transistor 8 (the N channel sense amplifier driver transistor 8 arranged between the bit line pairs BT1, BN1 and BT2, BN2) driving the sense amplifier transistor having its gate G connected to the BT1 and BN1.

The sense amplifier transistor connected to the BT1 and BN1 is not operated. The drive ability of the entire sense amplifier driver transistor 8 can be controlled to reduce the power consumption.

The operation of the N channel sense amplifier driver transistor is the same as the above operation except that the sense amplifier driven by the N channel sense amplifier driver transistor in which its source S and drain D are connected is not driven.

The manufacturing method is the same as Embodiment 7.

Figure 17:
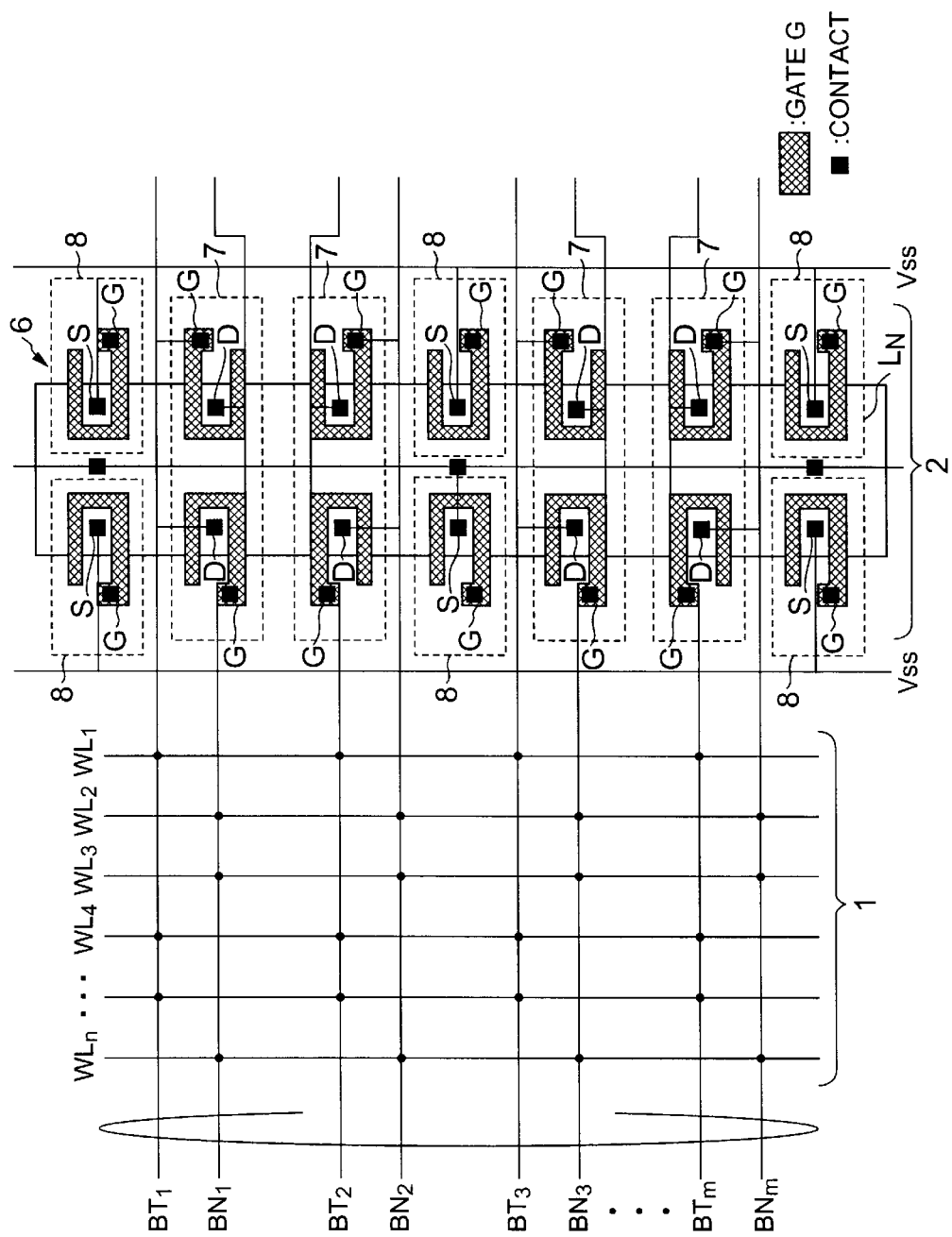
FIG. 17 is another schematic layout showing the N channel side sense amplifier region of the semiconductor memory device of Embodiment 8 of the present invention.
Figure 18:
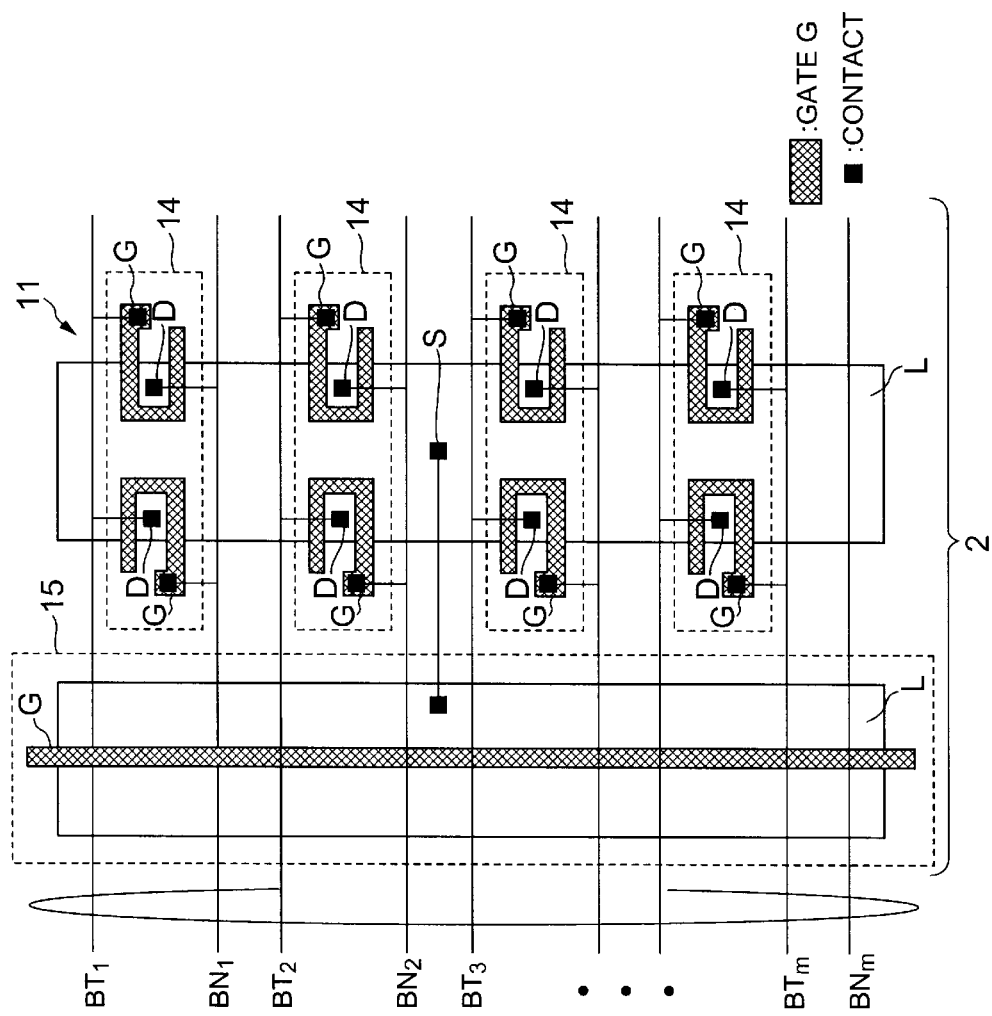
FIG. 18 is a schematic layout showing sense amplifiers of a prior art semiconductor memory device.
Figure 19:
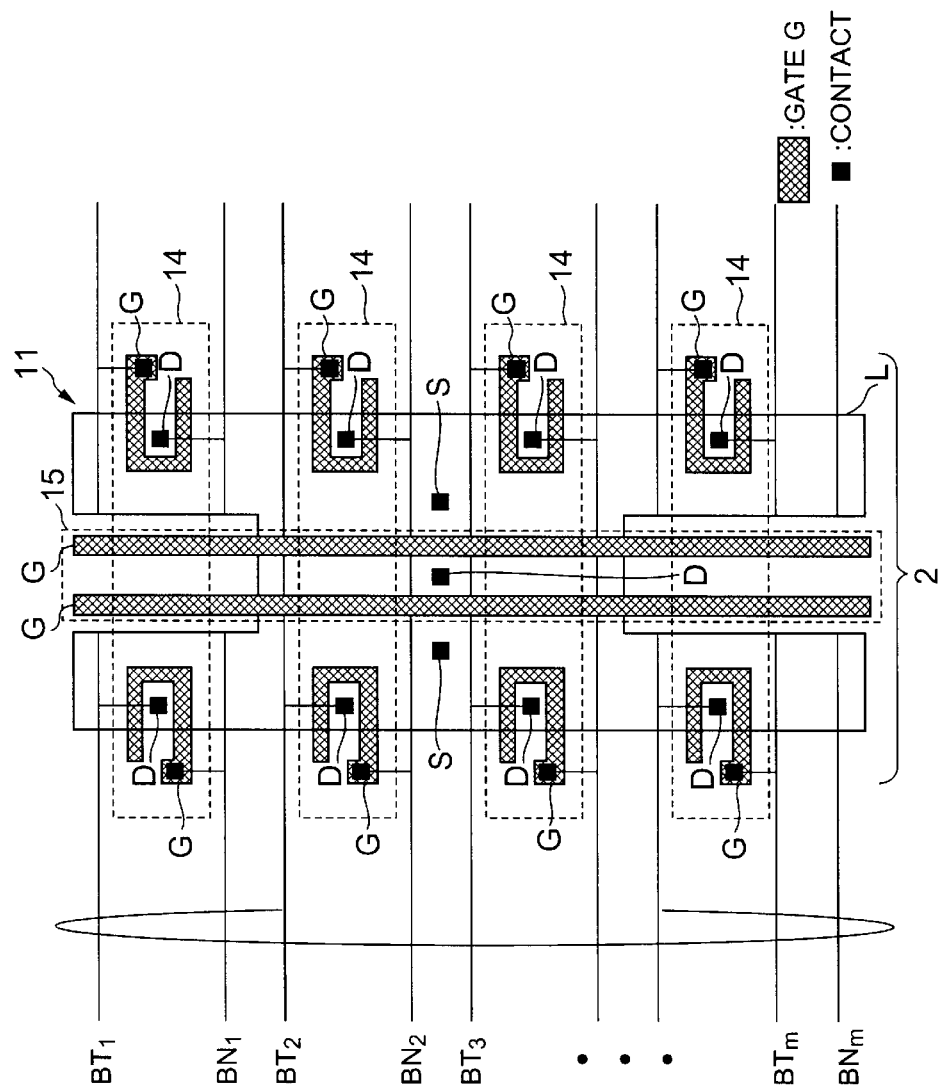
FIG. 19 is a layout showing a sense amplifier distribution method of the prior art semiconductor memory device.

Corresponding to FIG. 13 of Embodiment 6, the arrangement positions of the pair sense amplifier driver transistors 8 are shifted. As shown in FIG. 17, there are connected the source S and the drain D of the N channel sense amplifier driver transistor 8 driving a pair sense amplifier transistor 7 connected to the BT2 and BN2. The sense amplifier driver transistor can be off all the time. The drive ability of the entire sense amplifier driver transistor can be controlled to reduce the power consumption.

In the above embodiments, the P channel side sense amplifier region and the N channel side sense amplifier region are described separately. Both may be embodied to form the semiconductor memory device.

In an actual DRAM, based on the constructions shown in the above embodiments, a plurality of sense amplifier regions are formed to a plurality of memory cell arrays.

The invention which has been made by the present inventor is described specifically based on the embodiments. The present invention is not limited to the above embodiments and various modifications may be made in the scope without departing from its purpose.

According to the semiconductor memory device of the present invention, the sense amplifier driver transistors are formed in the same diffusion layer region as that of the sense amplifier transistors and are distributed on the diffusion layer region in the bit line direction and the word line direction to reduce the size of the sense amplifier region.

Although the invention has been described with reference to specific embodiments, this description is not meant to be construed in a limiting sense. Various modifications of the disclosed embodiments will become apparent to persons skilled in the art upon reference to the description of the invention. It is therefore contemplated that the appended claims will cover any modifications or embodiments as fall within the true scope of the invention.

What is claimed is:

1. A semiconductor memory device having a plurality of sense amplifier transistors connected to complementary bit lines of a memory cell array and a plurality of sense amplifier driver transistors driving said sense amplifier transistors, wherein said sense amplifier transistors and said sense amplifier driver transistors have gate electrodes, the gate electrodes of said sense amplifier transistors and said sense amplifier driver transistors being formed in arrays to divide a common diffusion layer region formed on the surface of a semiconductor substrate into two, respectively, and being arranged on the boundary of said diffusion layer region.

2. The semiconductor memory device according to claim 1, wherein the drain and the gate of said sense amplifier transistors are cross couple connected to a wire forming said complementary bit lines via a through hole, and its source is connected to a wire forming a sense amplifier common source via a through hole.

3. The semiconductor memory device according to claim 2, wherein the drain of said sense amplifier driver transistors is connected to said wire forming the sense amplifier common source via the through hole.

4. The semiconductor memory device according to claim 1, wherein the gates of said sense amplifier transistors and said sense amplifier driver transistors are substantially U shaped in a plan view.

5. The semiconductor memory device according to claim 1, wherein said sense amplifier transistors and said sense amplifier drive transistors are P channel transistors or N channel transistors.

* * * * *